United States Patent [19]
Baker et al.

[11] Patent Number: 5,185,648
[45] Date of Patent: Feb. 9, 1993

[54] PLURAL-WAVELENGTH INFRARED DETECTOR DEVICES

[75] Inventors: Ian M. Baker, Romsey; William A. E. Dunn, Nomanshand, both of England

[73] Assignee: U.S. Philips Corp., New York, N.Y.

[21] Appl. No.: 757,380

[22] Filed: Sep. 10, 1991

[30] Foreign Application Priority Data

Sep. 12, 1990 [GB] United Kingdom ............... 9019897

[51] Int. Cl.⁵ .......................................... H01L 27/14
[52] U.S. Cl. .................... 257/189; 257/442; 257/448; 257/446; 257/441; 257/466
[58] Field of Search ............. 357/30 B, 30 P, 30 H, 357/30 E, 32, 16, 68, 55

[56] References Cited

U.S. PATENT DOCUMENTS

| | | | |
|---|---|---|---|
| 4,521,798 | 6/1985 | Baker | 357/32 X |
| 4,639,756 | 1/1987 | Rosbeck et al. | 357/32 X |
| 4,956,686 | 9/1990 | Borrello et al. | 357/30 B |
| 4,972,244 | 11/1990 | Buffet et al. | 357/30 B |
| 4,996,579 | 2/1991 | Chu | 357/30 B |

FOREIGN PATENT DOCUMENTS

| | | | |
|---|---|---|---|
| 59-189685 | 10/1984 | Japan | 357/30 B |
| 61-214462 | 9/1986 | Japan | 357/30 B |
| 2197984 | 6/1988 | United Kingdom | 357/30 B |

*Primary Examiner*—William Mintel
*Attorney, Agent, or Firm*—William L. Botjer

[57] ABSTRACT

An infrared detector device for at least two wavelengths, i.e. 3 to 5 microns and 8 to 14 microns, comprises detector elements (10 and 20) formed in two or more infrared-sensitive materials with different badgaps, e.g. in cadmium mercury telluride. These materials may be provided side-by-side in a single level on a substrate (3) or preferably as different levels (1 and 2) on the substrate (3). Each detector element (10 and 20) comprises a p-n junction (11 and 21) between opposite conductivity type regions (12,13 and 22,23). Electrical connections (15,25,24) extend from these regions to the substrate (3). Freedom in design and fabrication is obtained by a connection structure in which one connection (25) of the longer-wavelength response element (20) contacts both the semiconductor material (2) of that element (20) and the larger-bandgap material (1) of the shorter-wavelength response element (10), at a side-wall (42) of both materials. The larger-bandgap material (1) comprises a further region (18) which adjoins the side-wall (42) and which forms a further p-n junction (19) electrically in parallel with the p-n junction (21) of the longer-wavelength detector element (20).

7 Claims, 1 Drawing Sheet

PLURAL-WAVELENGTH INFRARED DETECTOR DEVICES

DESCRIPTION

BACKGROUND OF THE INVENTION

This invention relates to plural-wavelength infrared detector devices including first and second detector elements comprising respective first and second infrared-sensitive semiconductor materials of different bandgaps, each detector element comprising a p-n junction. More information about the wavelength characteristics of an object or a scene can be obtained by viewing it using such a plural-wavelength infrared detector device so that, for example, such a device can permit the temperature of a radiation source to be measured independent of the emissivity of the source and the transmission of the intervening space. The different bandgap materials may be provided as different levels on a substrate.

Published European patent application EP-A-0 087 842 which corresponds to U.S. Pat. No. 4,555,720 discloses a plural-wavelength infrared detector device comprising upper and lower levels of infrared-sensitive semiconductor material provided on a substrate. The lower level is located between the upper level and the substrate and insulated from the upper level by an intermediate insulating layer. A detector element is formed in each level, and each detector element may comprise a p-n junction between opposite conductivity-type regions of the semiconductor material. Electrical connections are present from the detector-element regions to the substrate. The semiconductor material of a first of the upper and lower levels has a smaller bandgap than the second of the levels so as to provide its detector element with a response to a longer infrared wavelength. The substrate may be, for example, an insulating support carrying conductor tracks, or the substrate may be, for example, a silicon integrated circuit for processing the output signals from the detector elements. The whole contents of EP-A-0 087 842 are hereby incorporated herein as reference material.

An advantageous connection structure for the upper-level detector element(s) is disclosed in EP-A-0 087 842. In this structure, the upper level bridges a gap in the lower level between the lower-level detector element(s) and a separate part of the lower-level material; this separate part comprises or carries the connection to the upper level, for example as metallization on a side-wall of the separate part. Specific embodiments are described in which the lower-level material has the smaller bandgap so that its detector element has a cut-off wavelength of approximately 11 μm (micrometers); the connections to the smaller-bandgap detector element(s) are formed entirely in the lower level and before providing the upper-level material.

SUMMARY OF THE INVENTION

The present invention provides an advantageous connection structure for the smaller-bandgap detector element which gives a further degree of freedom in the design and fabrication of the plural wavelength detector device. It may be adopted in devices either having different levels for the different bandgap materials or having the different bandgap materials in a single level.

According to the present invention, there is provided a plural-wavelength infrared detector device including first and second detector elements comprising respective first and second infrared-sensitive semiconductor materials, and a substrate carrying the detector elements, the first semiconductor material having a smaller bandgap than the second semiconductor material so as to provide the or each first detector element with a response to a longer infrared wavelength, each detector element comprising a p-n junction between opposite conductivity-type regions of the semiconductor material, and electrical connections from the detector-element regions to the substrate, which device is characterised in that the electrical connection between the substrate and one region of the longer-wavelength response detector element extends on a side wall of both the first and second semiconductor materials, and in that the larger-bandgap second material comprises a further region which adjoins the side wall and which forms a further p-n junction electrically in parallel with the p-n junction of the first detector element, the further p-n junction having a higher impedance than this p-n junction of the first detector element in the smaller-bandgap first material.

As a result primarily of the different bandgaps of the semiconductor materials provided for the different wavelength responses of the detector elements in this plural wavelength detector device, the p-n junction in the larger-bandgap further region has a significantly higher impedance. Due to this higher impedance, the output signal in this side wall connection to both materials is dominated in operation of the device by the photocurrent signal generated in the smaller-bandgap detector element, even though the two p-n junctions are electrically in parallel. This permits the provision of one or more of the connections of the smaller-bandgap detector element in a more convenient or simple manner during the fabrication of the device.

Although this connection structure in accordance with the invention may be used in devices having the different bandgap materials in a single level on the substrate, it is particularly useful in devices in which the different bandgap materials are provided as different levels on the substrate. Furthermore, such a connection structure is sufficiently versatile that it may also be used, if so desired, in combination with the EP-A-0 087 B42 connection structure for the upper-level detector element(s).

Thus, as a particularly advantageous embodiment in accordance with the present invention, there is provided a plural-wavelength infrared detector device comprising upper and lower levels of infrared-sensitive semiconductor material provided on a substrate, the lower level being located between the upper level and the substrate, and a detector element formed in each level, each detector element comprising a p-n junction between opposite conductivity-type regions of the semiconductor material, and electrical connections from the detector-element regions to the substrate, the semiconductor material of a first of the upper and lower levels having a smaller bandgap than the second of the levels so as to provide its detector element with a response to a longer infrared wavelength, which device is characterised in that the electrical connection between the substrate and one region of the longer wavelength response detector element extends on a side-wall of the semiconductor materials of both the upper and lower levels, and in that the larger-bandgap material of the second level comprises a further region which adjoins the side-wall and which forms in the second level a further p-n junction electrically in parallel with the detector-element p-n junction in the first level and having a higher impedance than the detector-element p-n junction in the smaller-bandgap material of the first level.

When the smaller-bandgap material is present in the lower level, at least one of the electrical connections of the longer wavelength response detector element in the lower level extends downward from the upper level on the side wall of said further region which is present in the upper level, and so this lower-level connection can be made after providing the upper-level material. Thus, for example, it may be made in the same processing steps as are used to provide one or more connections to the upper-level detector element(s).

The electrical connection of said one region of the longer wavelength response detector element may comprise metallization on a side wall of an aperture passing locally through the thickness of the upper and lower levels and surrounded by the one region of the longer-wavelength detector element in the first level and by the further region in the second level. This aperture structure can provide a very compact geometry for the connection and in particularly advantageous for connections in arrays of detector elements mounted on a signal-processing circuit substrate, as disclosed in published European patent application EP-A-0 061 803 which corresponds to U.S. Pat. No. 4,521,798, the whole contents of which are hereby incorporate herein as reference material.

The other region of the longer-wavelength response detector element may have an electrical connection which extends on another side wall of the semiconductor materials of both the upper and lower levels. This other connection of the longer-wavelength response detector element may contact one of the regions of the shorter-wavelength response detector element so as to provide a common connection for both detector elements. These features can simplify the provision of the other connection, and this is advantageous particularly but not exclusively in arrays of detector elements of the different wavelength responses.

BRIEF DESCRIPTION OF THE DRAWING

These and other features in accordance with the present invention will now be illustrated, by way of example, in embodiments of the invention which are now described with reference to the accompanying diagrammatic drawings. In these drawings.

Figure 1:
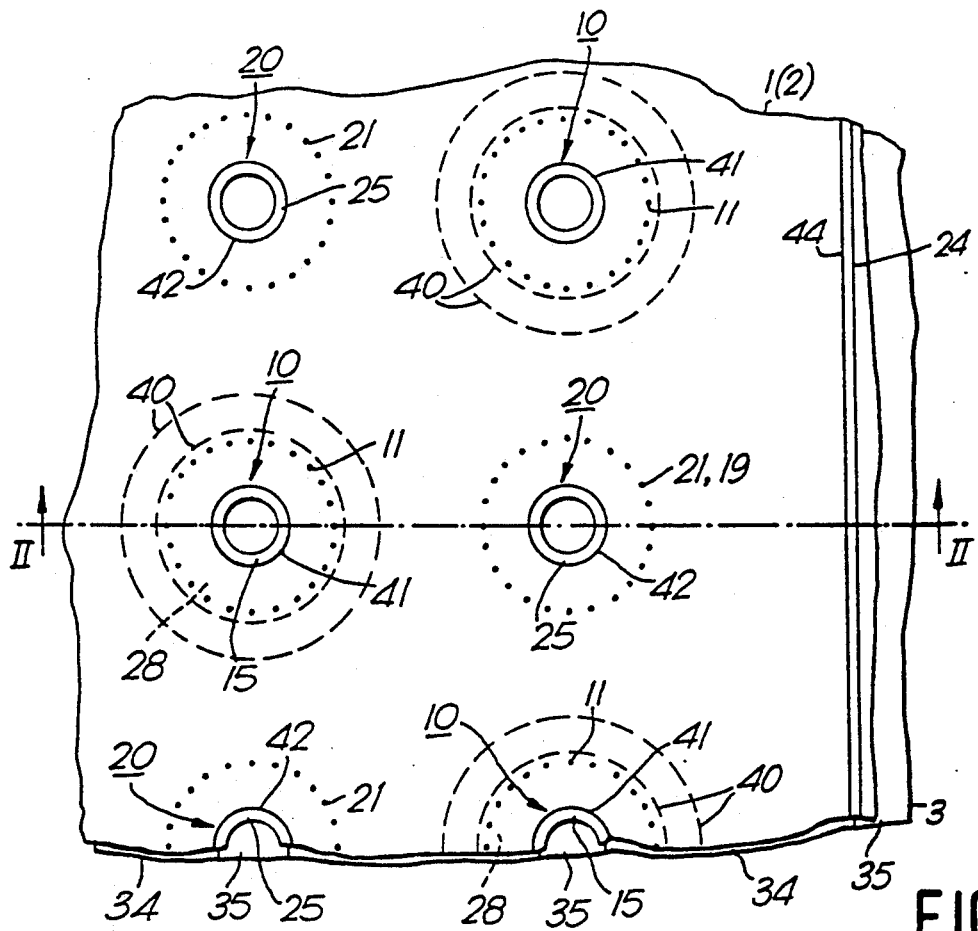
FIG. 1 is a plan view of part of one embodiment of a two wavelength 2-dimensional infrared detector array device in accordance with the present invention.

It should be noted that the Figures are diagrammatic and not drawn to scale. The relative dimensions and proportions of some parts of these drawings have been shown exaggerated or reduced in size for the sake of clarity and convenience in the drawings. The same reference signs as used in one embodiment are generally used when referring to corresponding or similar parts in other embodiments. Dotted lines are used to denote p-n junctions. In general, semiconductor regions of the same conductivity type are hatched in the same direction in the cross-sectional views.

DETAILED DESCRIPTION OF THE PREFERRED EMBODIMENT

Figure 2:
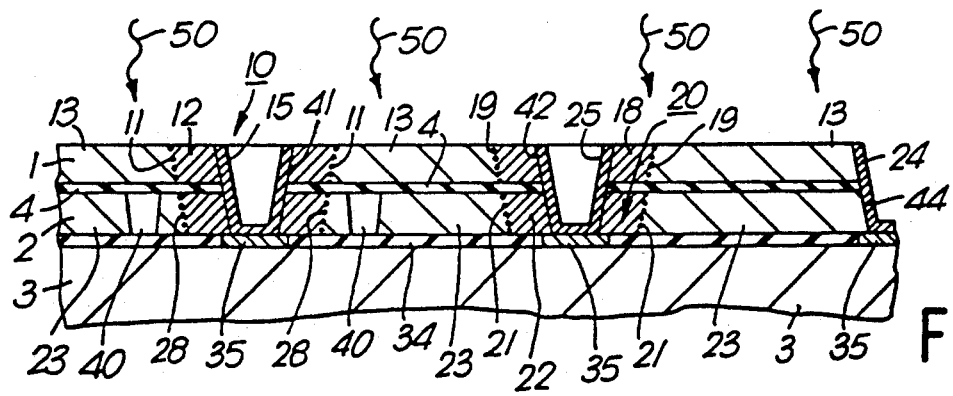
FIG. 2 is a cross-sectional view on the line II—II of FIG. 1, illustrating one specific example for the layer-structure of FIG. 1.

The device structure of FIGS. 1 and 2 illustrates one specific example of one embodiment of a plural-wavelength infrared detector device in accordance with the invention. In addition to benefiting from its construction in accordance with the present invention, this particular device also benefits from utilising the inventions disclosed in already-mentioned EP-A-0 061 803 (as can be seen especially from FIG. 1) and EP-A-0 087 B42 (as can be seen especially from FIG. 2).

As can be seen from FIG. 2, the device comprises upper and lower levels 1 and 2 of infrared-sensitive semiconductor material mounted on a surface of a substrate 3. The lower level 2 (located between the upper level 1 and the substrate 3) is insulated from the upper level 1 by an intermediate insulating layer 4. A different wavelength detector element 10 and 20 is formed in each level 1 and 2 respectively. Each detector element 10 (and 20) is a photodiode comprising a p-n junction 11 (and 21 respectively) between regions 12 and 13 (and 22 and 23 respectively) of opposite conductivity type in the semiconductor material. These photodiode elements 10 and 20 may be constructed in the same manner as disclosed in EP-A-061 803 with n type regions 12 and 22 and p type regions 13 and 23. The semiconductor materials of the levels 1 and 2 have different energy bandgaps so as to provide different wavelength responses. Thus, in the particular example of FIGS. and 2, the lower-level material 2 has a smaller bandgap than the upper-level material 1 so that the photodiodes 20 have a response to a longer wavelength than the photodiodes 10. Although FIGS. and 2 show only two levels 1 and 2 for the sake of simplicity in the illustration of the embodiment, it should be understood that three or more levels may be present. Thus, a plural wavelength infrared detector device in accordance with the invention may comprise detector elements having two, three or more different wavelength response characteristics.

Electrical connections 24,15 and 25 are present between the detector-element regions and the substrate 3. Thus, for example, as illustrated in FIG. 2, the regions 12 and 13 of the upper level photodiode 10 have connections 15 and 24 respectively, while the regions 22 and 23 of the lower-level photodiode 20 have connections 25 and 24 respectively. The substrate 3 may be an insulating support carrying a circuit pattern of conductor tracks 35 having non-insulated areas contacted by the photodiode connections 24,15 and 25. However, especially in the case of arrays of large numbers of detector elements 10 and 20, the substrate 3 preferably comprises a signal multiplexing and/or processing circuit and so may be formed as, for example, a silicon integrated circuit. This circuit may have contact areas 35 at windows in an uppermost insulating layer 34.

In accordance with one aspect of the present invention, the electrical connection 25 between the substrate 3 and one region 22 of the longer-wavelength response photodiode 20 extends on a side-wall 42 of the semiconductor materials of both the upper and lower levels 1 and 2. The larger-bandgap material in level 1 comprises a further region of which adjoins the side wall 42 and which forms in the level 1 a further p-n junction 19 electrically in parallel with the photodiode p n junction 21 in level 2. This further p-n junction 19 in the larger-bandgap material has a higher impedance than the photodiode junction 21 in the smaller-bandgap material 2.

In accordance with another aspect of the present invention, the other region 23 of the longer-wavelength response photodiode 20 has electrical connection 24 which extends on another side-wall 44 of the semiconductor materials of both the levels 1 and 2, and this connection 24 also contacts one region 13 of the shorter-wavelength response photodiode 10 so as to provide a common connection for both photodiodes 10 and 20.

Figure 3:
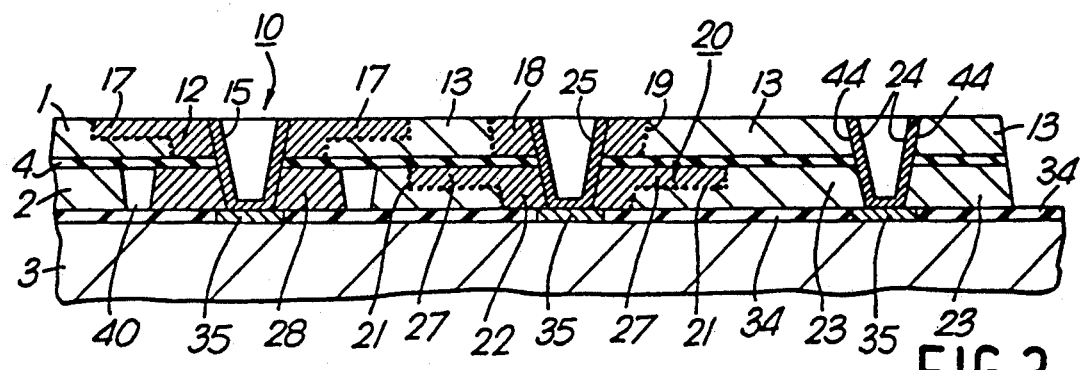
FIG. 3 is a cross-sectional view similar to that of FIG. 2 but incorporating various modifications in accordance with the invention.

In this particular embodiment, the shorter wavelength photodiode 10 is formed in the upper level 1. In accordance with the invention disclosed in EP-A-0 061 803, the connection 15 to the other region 12 of this photodiode 10 comprises an island 28 of the lower-level material 2 which is separated by a gap 40 from the region 23 of the lower-level photodiode 20. The gap 40 is annular and so the region 23 surrounds the islands 28. The upper photodiode 10 bridges this gap 40. In the particular form illustrated in FIGS. 1 and 2, the connection 15 comprises metallization carried on the side-wall 41 of an aperture through the island 28, and the island 28 includes a p-n junction which surrounds the aperture and which may be formed in the same processing steps as the photodiode p-n junctions 11 and/or 21. However, such a p-n junction need not be present in the island 28; thus, for example as illustrated in FIG. 3, the island 28 may be wholly one conductivity type, for example n type formed simultaneously with n type regions 12 and/or 22, the gap 40 being located where any resulting p-n junction might otherwise be formed.

In accordance with a further aspect of the present invention and utilising also the invention disclosed in EP-A-0 061 803, the side-wall connections 15 and 25 in this particular embodiment are formed as metallization on the side-wall 41 and 42 respectively of an aperture passing locally through the thickness of both levels 1 and 2. The aperture wall 42 is surrounded by region 22 of the longer wavelength photodiode 20 in the level 2 and by the further region 18 in the level 1. The aperture wall 41 is surrounded by the region 12 of the shorter-wavelength photodiode 10 in the level 1 and by the island 28 in the level 2. The common connection 24 may be formed by metallization on a side-wall 44 at the periphery of the plural-level structure 1 and 2 (as is illustrated by way of example in FIGS. 1 and 2) or on a side-wall 44 of one or more local apertures (as illustrated in FIG. 3).

Other advantageous features also in accordance with the present invention will be described hereinafter in the more detailed description of the embodiments.

The device of FIGS. 1 and 2 may be designed for viewing a scene at wavelengths in two atmospheric windows, for example the 3 to 5 $\mu$m waveband and the 8 to 14 $\mu$m waveband. High performance is achieved at these wavelengths by using cadmium mercury telluride as the detector material cooled to cryogenic temperatures. Thus, for example the multi-level structure 1,2,3 may be cooled in known manner to a temperature of about 77K by being mounted on a cold finger in a dewar or other thermally insulated envelope; the lower-level material 2 may be $Cd_{0.21}Hg_{0.79}Te$ having a cut-off wavelength of approximately 11 $\mu$m at that temperature, whereas the upper-level material 1 may be $Cd_{0.3}Hg_{0.7}Te$ having a cut-off wavelength of approximately 5 $\mu$m at that temperature. These longer-and shorter-wavelength response cadmium mercury telluride compositions have respective bandgaps of approximately 0.113eV and 0.24 BeV at 77K.

The device structure of FIGS. 1 and 2 may be fabricated by bonding a thin p type body 2 of $Cd_{0.21}Hg_{0.79}Te$ to a silicon integrated circuit 3 by an intermediate film of epoxy adhesive. This epoxy film may form part of the uppermost insulating layer 34 in FIG. 2. Preferably the upper and lower surfaces of the body 2 are passivated, for example with a surface layer of cadmium telluride or zinc sulphide. The gaps 40 may then be etched in the body 2 to separate the islands 28 from the remainder of the body, for example using an etchant solution of bromine in methanol with a photoresist mask. Then a thin p type body 1 of $Cd_{0.3}Hg_{0.7}Te$ is bonded to the upper surface of the body 2 by an intermediate film of epoxy adhesive. This epoxy film may form at least part of the intermediate insulating layer 4 in FIG. 2. Preferably the upper and lower surfaces of the body 1 also are passivated, for example with cadmium telluride or zinc sulphide. Subsequently photolithographic, ion-etching and metallization process steps as described in EP-A-0 061 803 may be used for etching the apertures 41 and 42, forming the n type regions 12,28 and 18,22 around these apertures, and lining the apertures with metallization 15 and 25. A separate photolithographic and etching step (which does not convert the p type cadmium mercury telluride into the n type) is used to define the peripheral side wall 44 contacted by the metallization 24.

Although exposed to the incident infrared radiation 50, the separate island 28 has only the one connection 15 and so does not contribute to the output signal of the shorter wavelength photodiode 10 as measured by the silicon circuit 3. The further region 18 in the shorter-wavelength response material 1 forms a further p-n junction 19 which is connected in parallel with the longer-wavelength photodiode 20 by connections 24 and 25. However, because of the difference in bandgap, the photocurrent generated at this parallel junction 19 by the incident radiation is insignificant compared with that generated at the photodiode junction 21. The impedance across the p-n junction is proportional to the exponential of (Eg/k.T.) and the diffusion current is proportional to the exponential of (−Eg/k.T.), where Eg is the bandgap, T is the temperature and k is the Boltzmann constant. Thus, in an idealised case of p-n junctions at 77K with bandgaps of 0.248eV and 0.113eV for the levels 1 and 2 respectively, the ratio of impedance across the parallel junction 19 to that across the photodiode junction 21 could be as high as about $10^8$.

In a practical cadmium mercury telluride device, the p-n junctions 19 and 21 are far from the idealised case, and the impedance is a function of illumination by the infrared 50. Carrier multiplication by impact ionisation of thermally generated carriers and optically-generated carriers is currently believed to play the major role in reducing the impedance, although there are other mechanisms such as depletion-width modulation and tunnelling which also affect the impedance value. Although the conductance due to the carrier multiplication decreases as the bandgap increases, the relative effect compared to the idealised diffusion-current model becomes very much larger with increase in bandgap. Thus, these impedance-reducing effects are found to be more pronounced in short-wavelength detectors; and so, although the impedance of the long-wavelength photodiode 20 may still be about the same order of magnitude both when illuminated by the infrared 50 and when not illuminated, that of the shorter-wavelength photodiode 10 may reduce by several orders of magnitude when illuminated.

The technology disclosed in EP-A-0 061 803 is particularly advantageous for forming good quality p-n junctions around apertures 41 and 42 in cadmium mercury telluride. Using this technology, long-wavelength response photodiodes 20 have been formed in the 0.113eV bandgap material 2 with an impedance of the order of 1 MΩ measured between connections 24 and 25; whereas the corresponding impedance measured for the further p-n junction structure 19 in the 0.248eV bandgap material 1 was of the order of 1 GΩ without illumination, dropping to about $10^3$ MΩ with illumination. This provides a ratio for the impedance of the illuminated junction 19 as compared with the illuminated junction 21 of between $10^2$ and $10^3$. This remaining impedance ratio still results primarily from the different bandgaps (with their exponential relationship to impedance) and is sufficient to ensure that the output signal in the connection 25 is dominated by the photo-current generated at the smaller-bandgap photodiode junction 21 rather than the very much smaller signal at the parallel junction 19 in the larger-bandgap material 1. In order to achieve such domination, the impedance ratio for the junctions 19 and 21 is preferably one order of magnitude or more, and this can be readily achieved with the difference in bandgap required for the different wavelength responses of the plural wavelength detector device.

As described in EP-A-0 061 803 photodiodes with high impedance can be obtained in cadmium mercury telluride when the photovoltaic junction is formed locally through the thickness of the body around an aperture 41 or 42. However, modifications in accordance with the invention are possible in which at least a major part of the photovoltaic junction extends parallel to the major surface of the body. FIG. 3 illustrates one such situation in which the p-n junctions 27 and 17 are provided as lateral extensions from the vertical p-n junctions 21 and 11 respectively. These junctions 27 can be formed by n type surface regions provided at the surface of the p type body 2 before mounting the body 1, and the junctions 17 can be formed by n type surface regions provided in the body 1 before ion-etching the apertures 41 and 42. In the geometry illustrated in FIG. 3, the lateral extent of the junctions 17 and 27 is such that their boundaries substantially meet one another as seen in the plan view at the surface of the circuit substrate 3. In both the device of FIGS. 1 and 2 and the device of FIG. 3 the detector elements 10 in one level 1 are located between the detector elements 20 in the other level 2, as seen in this plan view. However plural-wavelength array geometries are also possible in which the junctions 17 and 27 extend further so as to overlap as seen in plan view at the substrate 3.

In both the device of FIGS. 1 and 2 and that of FIG. 3 the connections 15 and 25 are at side-walls of local apertures 41 and 42 and a group of detector elements are present in each level 1 and 2. However, the semiconductor material at each level 1 and 2 may be divided into separate islands for each detector element 10 and 20; in this case the connections 15 and 25 may be provided at one side wall of each island and connections 24 may be provided at another side-wall of each island. Such a structure may be adopted for a small number of detector elements 10 and 20 at each level or in a device with a single detector element 10 and 20 at each level 1 and 2 respectively. However, side wall connections at local apertures 41 and 42 may be used even in the case of a single detector element at each level. Furthermore, the connections 15,25 and 24 need not be confined to the side-walls but may extend also on the major surfaces of the bodies 1 and 2, for example on a same conductivity type region along the major surface or on an insulating layer on the major surface. Although the side wall connections 24,15 and 25 described in these embodiments are formed by metallization, at least some of the electrical connections in some device structures in accordance with the invention may be formed either wholly or partly by highly-doped regions of the semiconductor material in each level, for example by n type regions adjacent the side walls.

Although embodiments have been described in which the cadmium mercury telluride levels 1 and 2 have been bonded together and to the substrate 3 by an epoxy adhesive, a plural level structure may alternatively be grown by deposition, for example using vapour phase epitaxy of cadmium mercury telluride on the substrate 3. Thus, for example, after growing a cadmium telluride layer on the circuit substrate, the gas flow may be switched to grow a lower level 2 of cadmium mercury telluride, then an insulating layer 4 of cadmium telluride, then an upper level 1 of cadmium mercury telluride of different bandgap and then an upper cadmium telluride passivation layer.

Although high performance detectors for the 3 to 5 μm and 8 to 14 μm wavebands can be obtained with cadmium mercury telluride, other materials may alternatively be used for detector elements in at least one level 1 or 2. Thus, for example, level 1 and/or level 2 may be of another ternary intermetallic chalcogenide such as lead tin telluride. Binary semiconductor compounds such as for example lead sulphide or indium antimonide may be used. Even single-element materials such as silicon or germanium may be chosen for a short-wavelength infrared detector element. The material and/or composition of the two levels 1 and 2 is chosen from such materials so that the different bandgaps give their desired different wavelength responses for the different detector elements 10 and 20. Thus, for example, the different detector elements 10 and 20 may respond to infrared-wavelengths in different atmospheric windows, 1 to 2 μm, 3 to 5 μm, 8 to 14 μm, and 16 to 22 μm, or even to different wavelength ranges in the same atmospheric window.

In some detector devices it may be desirable for the detector elements 10 and 20 to face the substrate 3 and to receive the incident radiation 50 via the substrate 3. Thus, the shorter-wavelength detector element having the larger bandgap may be present in the lower level 2 on the substrate 3, and the upper level 1 then comprises the longer-wavelength detector element having the smaller bandgap. In this case, the further region 18 with p-n junction 19 is formed in the lower level 2, and either the isolating gap 40 and island 2B are formed in the upper level 1 or this area of the upper level 1 is totally removed.

Although the invention is particularly useful in plural-level detector structures, a connection structure in accordance with the present invention may also be used in a plural wavelength single level detector structure. Thus, for example, the different wavelength response photodiodes 10 and 20 may be formed side-by-side in a single level comprising the different-bandgap infrared-sensitive materials side-by-side on the substrate 3. In this case, a compact structure can be obtained with the connection 25 of the longer-wavelength photodiode 20 contacting (at a side wall of, for example, an aperture or channel 42 in the single level) both the region 22 of the small-bandgap material of the photodiode 20 and the region 18 of the neighbouring larger-bandgap material. As in the embodiments of FIGS. 1 to 3, the difference in bandgap of the infrared-sensitive materials in this single-level embodiment results in an adequate difference in impedance for the junctions 21 and 19 so that the output signal in the connection 25 is dominated by the photocurrent generated in the smaller-bandgap detector element 20.

From reading the present disclosure, other variations will be apparent to persons skilled in the art. Such variations may involve equivalents and other features which are already known in the design, manufacture and use of infrared detector devices, systems and component parts thereof, and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A plural wavelength infrared detector device including first and second detector elements comprising respective first and second infrared sensitive semiconductor materials, and a substrate carrying the detector elements, the first semiconductor material having a smaller bandgap than the second semiconductor material so as to provide each first detector element with a response to a longer infrared wavelength, each detector element comprising a pn junction between opposite conductivity-type regions of the respective semiconductor materials, and electrical connections from the detector-element regions to the substrate, wherein the improvement comprises that the electrical connection between the substrate and one region of the longer wavelength response detector element extends on a side wall of both the first and second semiconductor materials, and in that the larger bandgap second material comprises a further region which adjoins the side wall and which forms a further pn junction electrically in parallel with the pn junction of the first detector element, the further pn junction having a higher impedance than the pn junction of the first detector element in the smaller bandgap first material.

2. An infrared detector device as claimed in claim 1, further characterised in that the first and second semiconductor materials are provided as different levels on the substrate, a lower level of semiconductor material is located between an upper level and the substrate, in that at least one detector element is formed in each level, in that a first of the upper and lower levels has the smaller bandgap material, in that the electrical connection between the substrate and the one region of the longer wavelength response detector element extends on a side wall in both the upper and lower levels, in that the larger bandgap material of the second level comprises the further region, and in that the further p-n junction is formed detector element p-n junction in the first level.

3. An infrared detector device as claimed in claim 2, further characterised in that the smaller bandgap material is present in the lower level, and so at least one of the electrical connections of the longer wavelength response detector element in the lower level extends downward from the upper level on the side wall of said further region which is present in the upper level.

4. An infrared detector device as claimed in claim 2, further characterised in that the electrical connection on the side wall comprises metallization on a side wall of an aperture passing locally through the thickness of the upper and lower levels and surrounded by the one region of the longer wavelength detector element in the first level and by the further region in the second level.

5. An infrared detector device as claimed in claim 2, further characterised in that the other region of the longer wavelength response detector element has an electrical connection which extends on another side wall of the semiconductor materials of both the upper and lower levels and contacts one of the regions of the shorter wavelength response detector element so as to provide a common connection for both detector elements.

6. An infrared detector device as claimed in claim 5, further characterised in that a separate part of the smaller bandgap material in the lower level is separated from the longer wavelength response detector element by a gap, in that the gap is bridged by the upper level material, and in that another connection of the upper level shorter wavelength response detector element extends to the substrate via the separate part of the smaller bandgap material.

7. An infrared detector device as claimed in claim 1, and further characterised by comprising a group of both first and second detector elements, and in that the first detector elements are located between the second detector elements, as seen in plan view at the surface of the substrate.

* * * * *